United States Patent [19]

McCoy

[11] Patent Number: 5,912,909
[45] Date of Patent: Jun. 15, 1999

[54] METHOD AND APPARATUS FOR EFFICIENT IMPLEMENTATION OF CHECKSUM CALCULATIONS

[75] Inventor: Dean Joseph McCoy, Vista, Calif.

[73] Assignee: NCR Corporation, Dayton, Ohio

[21] Appl. No.: 08/949,642

[22] Filed: Oct. 14, 1997

[51] Int. Cl.$^6$ .......................... G06F 11/10; H03M 13/00
[52] U.S. Cl. ........................................ 371/53; 364/745.02
[58] Field of Search .................... 371/53, 54; 364/745.02

[56] References Cited

U.S. PATENT DOCUMENTS

| | | | |
|---|---|---|---|
| 5,218,563 | 6/1993 | Juri et al. ........................... | 364/745.02 |
| 5,329,475 | 7/1994 | Juri et al. ........................... | 364/745.02 |

OTHER PUBLICATIONS

J. Touch, B. Parham; *Implementing the Internet Checksum in Hardware*, ISI Informational Memo, Apr. 1996, pp. 1–21.

*Primary Examiner*—Phung M. Chung
*Attorney, Agent, or Firm*—Merchant, Gould, Smith, Edell, Welter & Schmidt

[57] ABSTRACT

An apparatus and method is disclosed for an improved implementation for calculating a checksum. The present invention includes a plurality of addition circuits forming at least a first and a final addition stage. The addition circuits receive a data bit stream and perform addition on data bit pairs emanating from the data bit stream to obtain a checksum value. Carry bits generated by the addition circuits are propagated as additional upper data bits until the final addition stage wherein the carry bits are added to lower bits to obtain a final checksum value. The data bit stream may be a sixty-four bit data stream such that the data bit pairs are four sixteen bit pairs. The final stage accepts a limited carry value input to guarantee that a final carry bit is not generated at the final addition stage. Thus, the checksum circuit propagates the carry bits from each addition down the pipeline wherein the carry bits can be added at the end rather than at each addition stage. Further, the checksum circuit guarantees that there will never be a carry-out at the final addition stage thus eliminating the need for a final adder or carry look-ahead logic.

9 Claims, 3 Drawing Sheets

METHOD AND APPARATUS FOR EFFICIENT IMPLEMENTATION OF CHECKSUM CALCULATIONS

BACKGROUND OF THE INVENTION

1. Field of the Invention.

This invention relates in general to the detection of errors in a data stream, and more particularly to an apparatus and method providing improved efficiency in calculating a checksum.

2. Description of Related Art

Checksum generation is useful in communication among processors interconnected in a network. In a typical network, a packet of information containing, for example, a binary-encoded bit string of control information and data, may be transmitted from an originating processor to a destination processor directly, or through one or more intermediate processors. During transmission, errors may be introduced into the information packet by noise or interference in transmission (which may cause loss if they occur in the packet headers or corruption if they occur in the packet payload). Processing of an erroneous packet by an intermediate or destination processor may cause that processor to reject, or lose the packet, and may also cause the processor to fail.

To guard against such lost packets and failures, error-checking mechanisms may be used to verify the correctness of bits received at a processor, allowing erroneous information packets to be discarded before causing faulty processing to occur. A checking mechanism could involve generating an arithmetic quantity based on some of the bits to be sent from an originating processor, including the arithmetic quantity in the packet when the packet is transmitted, and then verifying the quantity when the packet is received by an intermediate or destination processor. One such error-checking mechanism is a so-called arithmetic checksum.

Networking devices which use Internet protocols use an Internet checksum to check for data corruption in headers and packet bodies. Efficient software implementations of the Internet checksum algorithm are often embedded in data copying operations. However, these copying operations are increasingly being performed by dedicated direct memory access (DMA) hardware. Accordingly, DMA hardware designs are beginning to incorporate dedicated hardware to compute the Internet Checksum during the data transfer. Such hardware must calculate the Internet Checksum on a 16-bit wide data stream.

The traditional approach of calculating the Internet checksum requires doing 16-bit additions on each pair of a 16-bit data stream and then folding the carry bit from this addition back into the result. This one's complement addition operation requires either a two's complement adder followed by a second adder to add in the remaining carry, two cycles per add using the same adder, or carry-lookahead logic to generate a carry-in signal if a carry would result in the add. However, all these options are fairly costly in terms of gate count and speed. With the targeted technology and desired clock period, only two two's complement additions or one addition with carry-lookahead logic could occur in one cycle.

RFC 1936, entitled "Implementing the Internet Checksum in Hardware", describes implementing the one's complement adder by using several 2-bit and 3-bit full-lookahead two's complement adders chained in a ring via carry bit registers. Therefore, RFC 1936 doesn't save any pipeline clock cycles and the gate savings is insignificant.

It can be seen then that there is a need for checksum hardware that significantly reduces the amount of circuitry required to yield the same results.

It can also be seen that there is a need for a checksum circuit which propagates the carry bits from each addition down the pipeline wherein the carry bits can be added at the end rather than at each addition stage.

It can also be seen that there is a need for checksum hardware that calculates the Internet checksum while guaranteeing that there will never be a carry-out at the final addition stage thus eliminating the need for a final adder or carry look-ahead logic.

SUMMARY OF THE INVENTION

To overcome the limitations in the prior art described above, and to overcome other limitations that will become apparent upon reading and understanding the present specification, the present invention discloses an apparatus and method for improved implementation of hardware for calculating a checksum.

The present invention solves the above-described problems by providing a checksum circuit which propagates the carry bits from each addition down the pipeline wherein the carry bits can be added at the end, rather than at each addition stage, and which guarantees that there will never be a carry-out at the final addition stage thus eliminating the need for a final adder or carry look-ahead logic.

A system in accordance with the principles of the present invention includes a plurality of addition circuits forming at least a first and a final addition stage. The addition circuits receive a data bit stream and perform addition on 16-bit data quantities emanating from the data bit stream to obtain a checksum value. Carry bits generated by the addition circuits are propagated as additional upper data bits until the final addition stage wherein the carry bits are added to lower bits to obtain a final checksum value.

Other embodiments of a system in accordance with the principles of the invention may include alternative or optional additional aspects. One such aspect of the present invention is that the data bit stream comprises a sixty-four bit data stream.

Another aspect of the present invention is that the data bit pairs comprise four sixteen bit pairs.

Another aspect of the present invention is that the final stage accepts a limited carry value input to guarantee that a final carry bit is not generated at the final addition stage.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides optimized checksum hardware for generating the Internet Checksum on a stream of data. Optimization is achieved by propagating intermediate carries through the pipeline then adding them in at one time, and structuring the adders such that the maximum output from the final adder is a known value thereby guaranteeing that a final carry-out will not occur. The checksum hardware according to the present invention results in a savings of more than 25% in gates and 33% in clock cycles over the traditional hardware approach.

Figure 1:
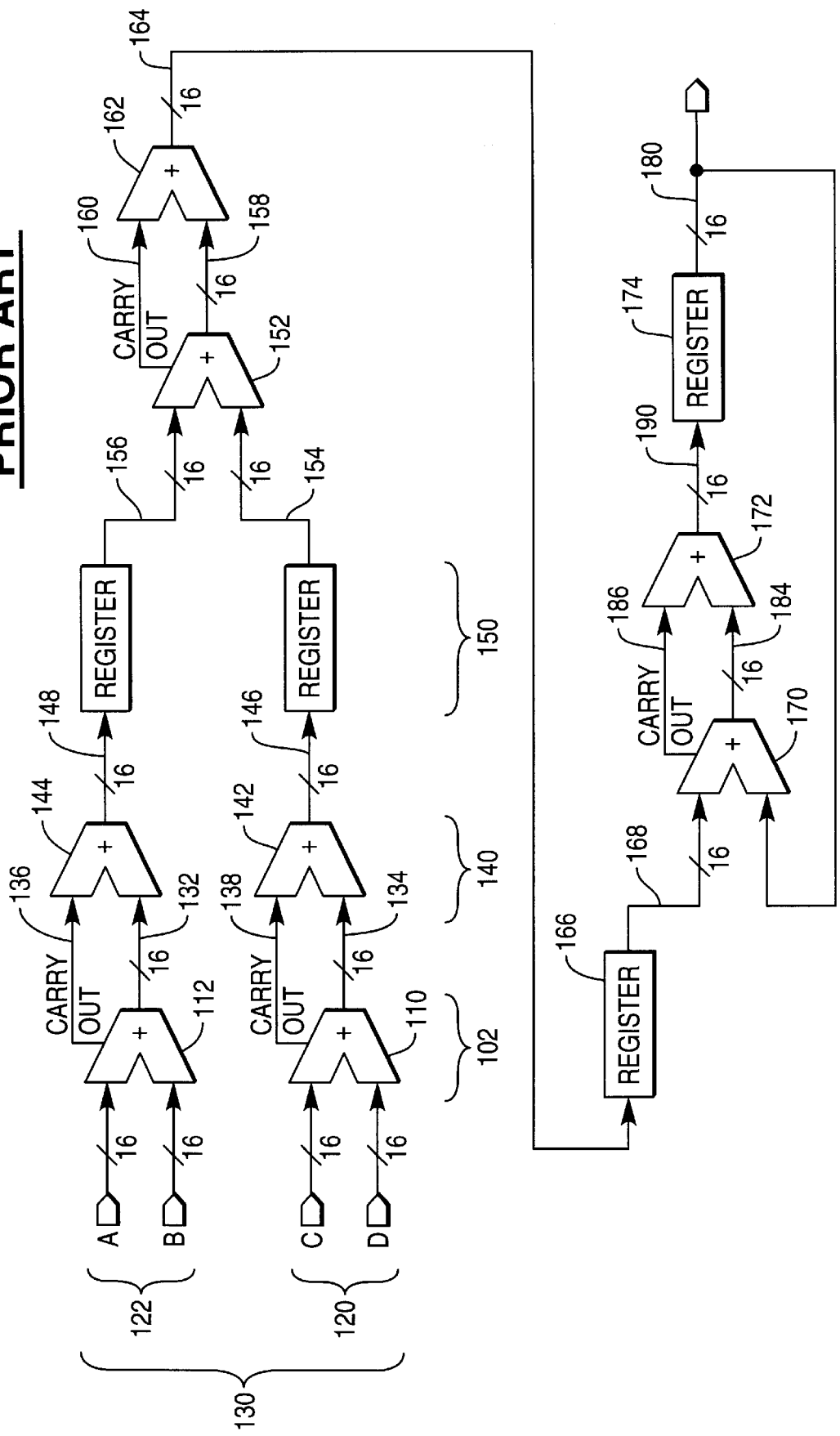
FIG. 1 illustrates a hardware implementation of the traditional checksum circuit.

FIG. 1 illustrates a hardware implementation of the traditional checksum circuit 100. In FIG. 1, a first level addition stage 102 includes a first 110 and second 112 adder. The first 110 and second 112 adder each receive and add a pair 120, 122 of sixteen bit data which emanate from a sixty-four bit wide data stream 130. The first 110 and second 112 adder each provide a sixteen bit output 132, 134 and, if generated, the first adders 110 provide a carry-out term 136, 138. A second level addition stage 140, which includes adders 142, 144 associated with each of the adders 110, 112 in the first level addition stage 102, adds the carry terms 136, 138 and the sixteen bit output 132, 134, respectively, from the first level adders 110, 112. The second level adders 142, 144 provide sixteen bit outputs 146, 148 to a first stage of registers 150.

The first stage of registers 150 are clocked to cause the two sixteen bit outputs 146, 148 from the second level adders 140 to be sent to a third level adder 152. The third level adder 152 adds the two sixteen bit outputs 154, 156 from the first stage of registers 150 to create a single sixteen bit output 158. The third level adder may also generate a carry-out bit 160.

A fourth level adder 162 receives the carry-out bit 160 from the third level adder 152 and the single sixteen bit output 158. The fourth level adder 162 generates a sixteen bit output 164 which is received by a second stage register 166.

The second stage register 166 is clocked to provide a sixteen bit output 168 to a fifth level adder 170. The fifth level adder 170 is coupled to a sixth level adder 172. The sixth level adder 172 is then coupled to a third stage register 174 that provides the final checksum output 180.

The fifth level adder 170 receives the sixteen bit output 168 from the second stage register 166 and the final checksum output 180. The fifth level adder 170 provides a sixteen bit output 184 and, if generated, a carry-out bit 186 to the sixth level adder 172. The sixth level adder 172 adds the carry-out bit 186 and the sixteen bit output 184 from the fifth level adder 170 to generate a sixteen bit output 190, which is then stored in the third stage register 170. The third stage register 174 then clocks out the sixteen bit output 190 as the final checksum 180.

However, according to the present invention, a checksum circuit can propagate the carry bits from each addition down the pipeline where they are added at the end rather than at each addition stage. Further, the checksum hardware according to the present invention can be designed so that the final stage accepts a limited carry value input to guarantee that a final carry bit is not generated at the final addition stage.

Figure 2:
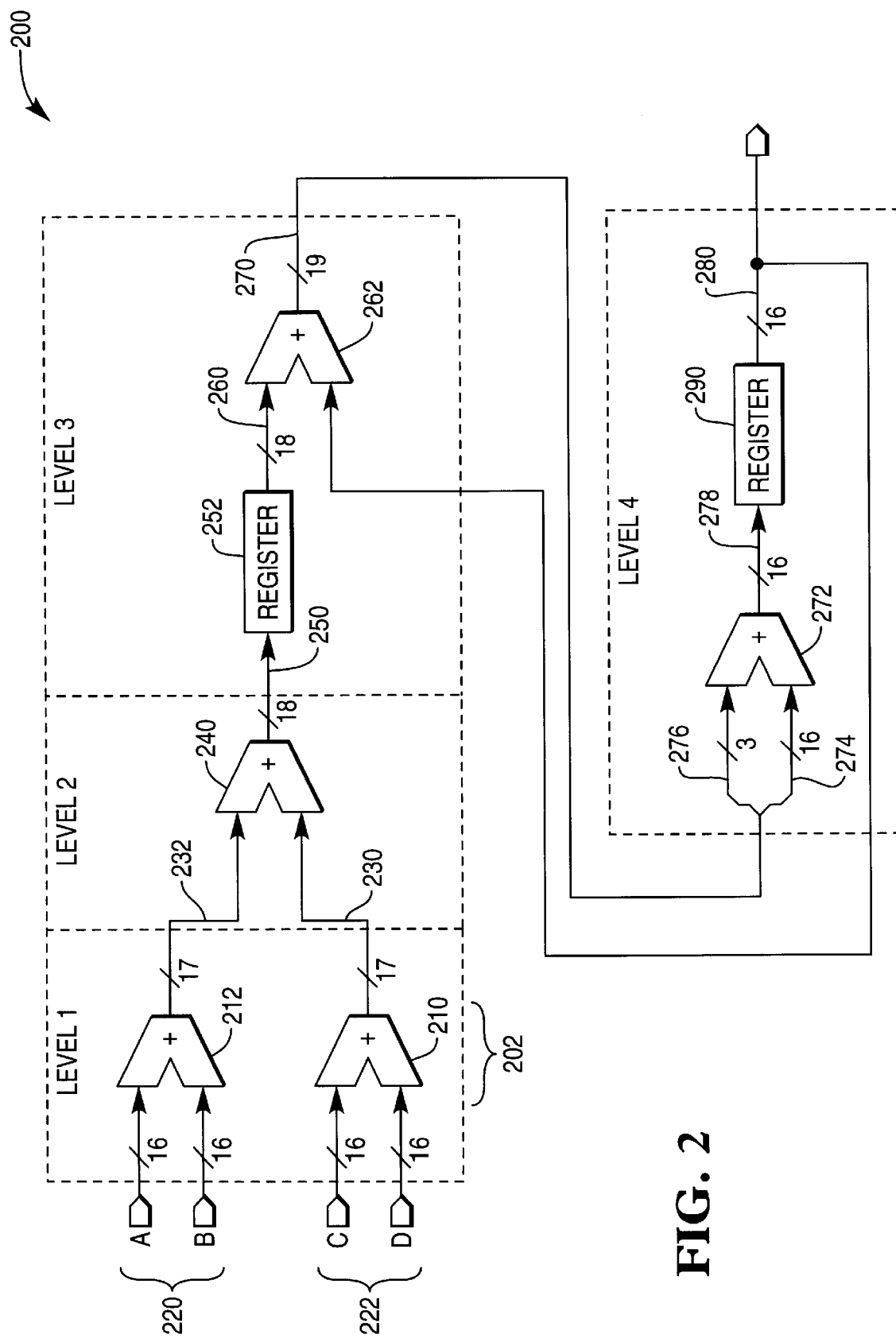
FIG. 2 illustrates an implementation of checksum hardware according to the present invention.

FIG. 2 illustrates an implementation of checksum hardware 200 according to the present invention. In FIG. 2, a first level addition stage 202 includes a first 210 and second 212 adder. The first 210 and second 212 adder each receive and add a pair of sixteen bit data 220, 222. The first 210 and second 212 adder then generate seventeen bit data outputs 230, 232 as a result. A second level addition stage 240 receives the seventeen bit data outputs 230, 232 and generates eighteen bit data 250 as a result. A first register 252 stores and clocks out the eighteen bit data 250 of the second level addition stage 240 as an eighteen bit data output 260.

A third level addition stage 262 is coupled to the first register 252 for receiving the eighteen bit data 260 of the first register 252. The third level addition stage 262 adds the sixteen bit checksum output 280 to the eighteen bit data output 260 of the first register 252 to generate a nineteen bit data output 270. A fourth level addition stage 272 receives the nineteen bit data output 270. The nineteen bit data output 270 is divided into a lower sixteen bits 274 and an upper three bits 276, wherein the upper three bits 276 represent the carry bits from the first 202, second 240 and third 262 level addition stages. The fourth level addition stage 272 generates sixteen bit data 278 as a result of the addition of the lower sixteen bits 274 and the upper three bits 276. A register 290 stores the sixteen bit data 278 of the fourth level addition stage 272 and outputs the sixteen bit data 278 as the checksum value 280.

In FIG. 2, the output 230, 232 from each adder 210, 212 in the first level 202 is a seventeen bit number ranging from 0 to $(2^{16}-1+2^{16}-1)$ or $2^{17}-2$. The output from the second level adder 240 is an eighteen bit number 250 ranging from 0 to $(2^{17}-2+2^{17}-2)$ or $2^{18}-4$. This value 250 is then added with the sixteen bit running total 280 in third level 262 to yield a nineteen bit number 270 ranging from 0 to $(2^{18}-4+2^{16}-1)$ or $2^{18}+2^{16}-5$. Represented in binary, this number is $1001111111111111011_2$.

The fourth level adder 272 then takes the upper three bits 276 of this number and adds it to the lower sixteen bits 274, thus effectively adding in all of the previous carries in one addition. The value of these upper three bits 276 can range from 0 to a maximum value of 4. Using this maximum value from the third level adder 262, the largest possible value from the addition in the fourth level adder 272 is $(2^{16}-5)+4=2^{16}-1$ which can be represented by a sixteen bit number. Therefore, there will never be a carry-out of the addition performed in the fourth level adder 272, thus saving the need for a final carry adder.

An additional advantage of this invention is in the fact that only two stages of registers 252, 290 are needed instead of three as in traditional circuits as shown in FIG. 1. This further reduces the amount of gates and reduces the required number of pipeline cycles from three to two. However, those skilled in the art will recognize that the invention is not meant to be limited to a sixty-four bit wide data stream. Checksum circuits in accordance with the teaching herein can be implemented to accommodate different types of bit streams.

Figure 3:
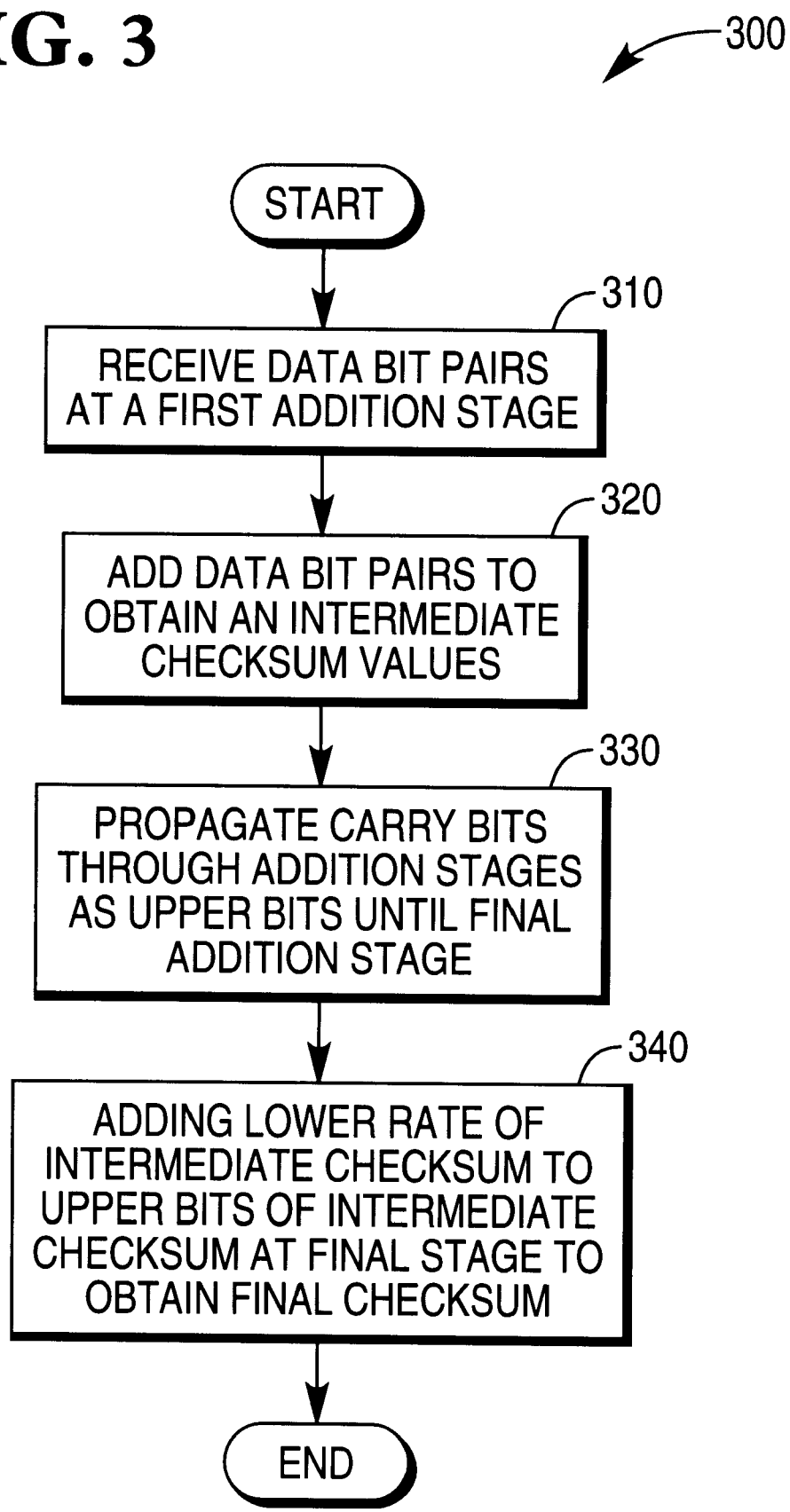
FIG. 3 illustrates a flowchart of the operation of the checksum hardware according to the present invention.

FIG. 3 illustrates a flowchart 300 representing the method of calculating a checksum value according to the present invention. First a data bit stream is received using a plurality of addition circuits forming at least a first and a final addition stage 310. The data bit stream is divided into data bit pairs. Addition on the data bit pairs is performed to obtain an intermediate checksum value 320. Carry bits generated by the addition on the data bit pairs are propagated as additional upper data bits of an intermediate checksum value until the final addition stage 330. Then the propagated carry bits are added to the lower bits of the intermediate checksum value at the final addition stage to obtain a final checksum value 340.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A checksum calculating circuit, comprising a plurality of addition circuits forming at least a first and a final addition stage, the addition circuits receiving a data bit stream and performing addition on data bit pairs emanating from the data bit stream to obtain a checksum value, wherein carry bits generated by the addition circuits are propagated as additional upper data bits until the final addition stage and wherein the carry bits are added to lower bits at the final addition stage to obtain a final checksum value.

2. The checksum calculating circuit of claim 1 wherein the data bit stream comprises a sixty-four bit data stream.

3. The checksum calculating circuit of claim 2 wherein the data bit pairs comprise four sixteen bit pairs.

4. The checksum calculating circuit of claim 1 wherein the final stage accepts a limited carry value input to guarantee that a final carry bit is not generated at the final addition stage.

5. A checksum circuit for generating a sixteen bit checksum output value, comprising:

a first level addition stage comprising a first and second adder, the first and second adder each receiving and adding a pair of sixteen bit data and generating seventeen bit data outputs as a result;

the second level addition stage for receiving the seventeen bit data outputs and generating eighteen bit data as a result;

a register for storing and outputting the eighteen bit data of the second level addition stage;

a third level addition stage, coupled to the register, for receiving the eighteen bit data of the register and adding the sixteen bit checksum output to generate a nineteen bit data output;

a fourth level addition stage receiving the nineteen bit data output, the nineteen bit data output being divided into a lower sixteen bits and an upper three bits, the upper three bits representing the carry bits from the first, second and third level addition stages, the fourth level addition stage generating sixteen bit data as a result of the addition of the lower sixteen bits and the upper three bits; and a register, for storing the sixteen bit data of the fourth level addition stage and outputting the sixteen bit data as a checksum value.

6. A method of calculating a checksum value, comprising the steps of:

receiving a data bit stream using a plurality of addition circuits forming at least a first and a final addition stage;

dividing the data bit stream into data bit pairs;

performing addition on the data bit pairs to obtain a checksum value;

propagating carry bits generated by the addition on the data bit pairs as additional upper data bits of an intermediate checksum value until the final addition stage; and adding the propagated carry bits to lower bits of the intermediate checksum value at the final addition stage to obtain a final checksum value.

7. The method of claim 6 wherein the data bit stream comprises a sixty-four bit data stream.

8. The method of claim 7 wherein the data bit pairs comprise four sixteen bit pairs.

9. The method of claim 6 wherein the final stage accepts a limited carry value input to guarantee that a final carry bit is not generated at the final addition stage.

* * * * *